US007765504B2

(12) United States Patent
Douriet et al.

(10) Patent No.: US 7,765,504 B2
(45) Date of Patent: Jul. 27, 2010

(54) DESIGN METHOD AND SYSTEM FOR MINIMIZING BLIND VIA CURRENT LOOPS

(75) Inventors: Daniel Douriet, Round Rock, TX (US); Anand Haridass, Austin, TX (US); Andreas Huber, Leonberg (DE); Roger D. Weekly, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 418 days.

(21) Appl. No.: 11/829,179

(22) Filed: Jul. 27, 2007

(65) Prior Publication Data

US 2009/0031270 A1    Jan. 29, 2009

(51) Int. Cl.
G06F 17/50    (2006.01)
(52) U.S. Cl. .............................. 716/10; 716/9
(58) Field of Classification Search ............... 716/9, 716/10, 12, 13, 14
See application file for complete search history.

(56) References Cited

U.S. PATENT DOCUMENTS

| | | | |
|---|---|---|---|
| 6,581,195 | B2 | 6/2003 | Tanaka |
| 6,769,102 | B2 | 7/2004 | Frank et al. |
| 6,922,822 | B2 | 7/2005 | Frank et al. |
| 6,993,739 | B2 | 1/2006 | Becker et al. |
| 7,240,309 | B2 | 7/2007 | Saito et al. |
| 7,272,809 | B2 | 9/2007 | Becker et al. |

| | | | | |
|---|---|---|---|---|
| 2002/0084107 | A1* | 7/2002 | Chang et al. | 174/262 |
| 2008/0067665 | A1* | 3/2008 | Aziz et al. | 257/698 |

OTHER PUBLICATIONS

Brokow et al., "Grounding for Low- and High-Frequency Circuits", 1989, Analog Devices,, Analog Dialogue 23-3, Application Note AN-345 (4 pages).*
U.S. Appl. No. 12/021,363, filed Jan. 29, 2008, Christo, et al.
Hubing, et al., "Identifying and Quantifying Print Circuit Board Inductance", Aug. 1994, IEEE International Symposium on Electromagnetic Compatibility, Symposium Record, pp. 205-208.
Chen, et al., "Via and Return Path Discontinuity Impact to High Speed Digital Signal Quality", Oct. 2000, IEEE Conference on Electrical Performance of Electronic Packaging, Digest, pp. 215-218.

(Continued)

*Primary Examiner*—Sun J Lin
(74) *Attorney, Agent, or Firm*—Mitch Harris, Atty at Law, LLC; Andrew M. Harris; Diana R. Gerhardt (57) ABSTRACT

A design method and system for minimizing blind via current loops provides for improvement of electrical interconnect structure design without requiring extensive electromagnetic analysis. Other vias in the vicinity of a blind via carrying a critical signal are checked for suitability to conduct return current corresponding to the critical signal that is disrupted by the transition from a layer between two metal planes to another layer. The distance to the return current via(s) is checked and the design is adjusted to reduce the distance if the distance is greater than a specified threshold. If the blind via transition is to an external layer, suitable vias connect the reference plane at the internal end of the blind via to an external terminal. If the transition is between internal layers, suitable vias are vias that connect the two reference planes surrounding the reference plane traversed by the blind via.

30 Claims, 4 Drawing Sheets

OTHER PUBLICATIONS

Pak, et al. "Prediction and Verification of Power/Ground Plane Edge Radiation Excited by Through-Hole Signal Via Based on Balanced TLM and Via Coupling Model", Oct. 2003 IEEE Conference on Electrical Performance of Electronic Packaging, pp. 181-184.

U.S. Appl. No. 11/751,786, filed May 22, 2007, Chun, et al.

* cited by examiner

DESIGN METHOD AND SYSTEM FOR MINIMIZING BLIND VIA CURRENT LOOPS

BACKGROUND OF THE INVENTION

1. Technical Field

The present invention relates generally to circuit design software, and more particularly, to a methodology and computer program that perform design checks and design modification of buried blind via structures to minimize vertical current discontinuities.

2. Description of the Related Art

High-density interconnect schemes within and between processor packages and other very-large-scale integrated (VLSI) circuits, typically use a large number of circuit layers to connect one or more dies to electrical terminals disposed on one or more surfaces of the package, as well as to interconnect multiple dies in multi-die packages. With the high frequencies and/or narrow pulse widths of critical signals in present-day VLSI circuits, special layout techniques are typically required for routing critical signal paths to minimize reflections, impedance mismatches and coupling between signal paths, according to electromagnetic analysis techniques. Signal reference planes such as power planes are also typically provided between signal layers to provide controlled signal path impedance and to shield overlapping signal paths from each other.

Blind vias are conductive structures that interconnect endpoints of conductive signal paths that extend on two layers of a multi-layer circuit, but that do not extend vertically beyond the endpoints. When a critical signal is passed through a blind via, a vertical current component is introduced that couples to nearby vias to form a return path loop. The greater the distance between a critical signal blind via and a low impedance return path, the larger the circuit inductance due to discontinuity introduced by the via. Further, if the net lowest impedance return path includes signal vias, undesired coupling to the signal vias will also occur.

Extensive electromagnetic circuit analysis is not typically undertaken for determining such inductive effects and coupling, as accurate models are complex and computation-intensive. Furthermore, such modeling would have to be performed for each design iteration, dramatically increasing design time. Existing non-analytic techniques, such as automated or visual inspection of signal paths are typically two-dimensional and therefore do not take into account the three-dimensional nature of the problem.

It is therefore desirable to provide a design methodology and computer program that minimize blind via vertical current discontinuities without requiring an extensive electromagnetic analysis and that take into account the three-dimensional nature of the current discontinuities.

SUMMARY OF THE INVENTION

The objective of minimizing blind via vertical current discontinuities without requiring extensive electromagnetic analysis is provided in a method, system and computer program product. The system is a workstation computer having program instructions in memory for carrying out the method and the computer program product is a computer-readable storage medium encoding program instructions for carrying out the method.

The method searches the vicinity of each blind via carrying a critical signal for at least one other via that meets criteria for conducting return current associated with the critical signal from one metal reference plane to another metal reference plane. If the blind via is passing through an external metal reference plane, then the at least one other via is a via that connects the next internal metal reference plane to the external metal reference plane, thereby conducting the portion of the return current that was carried by the next internal metal reference plane to the external metal reference plane. If the blind via is transitioning across an internal metal reference plane, the at least one other via is a via that connects the other metal reference planes on either side of the internal metal reference plane, thereby "transporting" a portion of the reference current between the other metal reference planes. The distance between the blind via and the at least one other via is checked against a predetermined maximum value, to ensure that the current loops formed by the path of the critical signal and the return current(s) are minimized in area.

A region may be defined around the blind via extending to either the at least one other via, or to a closest critical signal or return current via, and the vias within that region examined. A ratio of critical signal vias to return current vias can be computed for the region and a "quality" value determined from the ratio can be produced for each critical signal blind via in the design. The quality value can be used for design check, design requirements, or to provide a value indicating a circuit noise figure of merit.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

The present invention concerns design methods and software for designing integrated circuit package substrates such as organic first level interconnect (FLI) packages, and other interconnecting circuit structures such as printed wiring boards (PWB), silicon interposers and any other structures relying on blind vias to provide interconnects for critical signals. The methods and software reduce the electromagnetic impact of discontinuities caused by blind vias carrying critical signals. Electromagnetic analysis is not required in the method or software, as the method provides design checks and design criteria that are imposed on the physical position of blind vias and other vias, in accordance with signal types for each of the vias as denoted in a netlist.

Figure 1A:
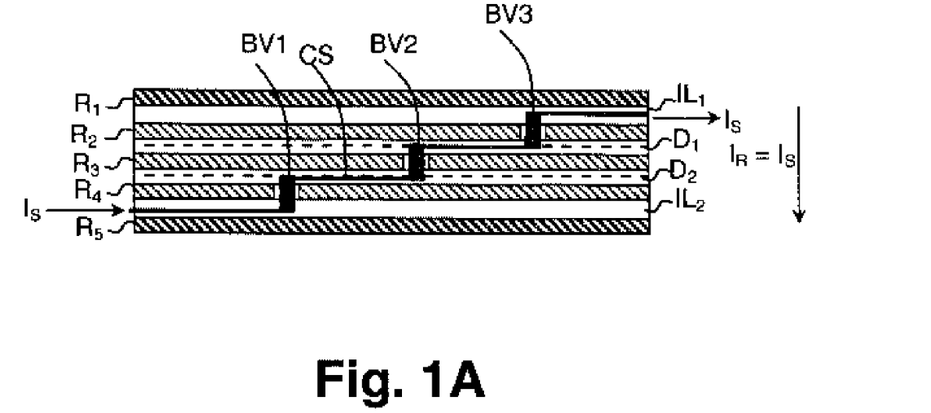
FIGS. 1A-1C are a cross-sectional views of integrated circuit substrate via and blind via locations that are analyzed and adjusted by a method in accordance with an embodiment of the present invention.

Referring now to FIG. 1A, a cross-section of an integrated circuit substrate that can be analyzed in accordance with an embodiment of the invention, is shown. A core formed from dielectric layers $D_1$ and $D_2$ sandwiched between metal reference plane layers $R_2$, $R_3$ and $R_4$, contains conductive signal paths CS disposed within dielectric layers $D_1$ and $D_2$. External insulating layers $IL_1$ and $IL_2$ and external metal reference plane layers $R_1$ and $R_5$ are laminated onto the core. In the illustrative embodiment, metal reference plane layers $R_1$, $R_3$ and $R_5$ are connected to one common power supply voltage source, e.g., ground and metal reference plane layers $R_2$ and $R_4$ are connected to another common power supply voltage source, e.g. VDD. However, the techniques of the present invention are applicable to other combinations and orders of metal reference plane layers, as long as at least one return current path may be commonly provided between a metal reference plane layer adjacent to a signal conductor at one level to another metal reference plane layer adjacent to a continuing signal conductor on another level. Blind vias BV1, BV2 and BV3 provide interconnection between portions of signal paths CS in dielectric layers $D_1$ and $D_2$ as well as to circuit layers or terminals external to the core layers and/or disposed within insulating layers $IL_1$ and $IL_2$. As shown in the Figure, blind vias BV1, BV2 and BV3 each introduce a vertical discontinuity in the path of a current $I_S$ that is passed through signal path CS and blind vias BV1, BV2 and BV3. At high frequencies, such as those present in critical signals, which may be high-frequency signals or narrow pulse-width low frequency signals, inductive and radiative effects due to signal path structures cause signal cross-coupling problems, impedance mismatches and signal distortion.

Since signal path CS is sandwiched between metal reference plane layers $R_2$, $R_3$ and $R_4$ in core-internal segments of signal path CS and between metal reference plane layers $R_1$ and $R_2$ or $R_4$ and $R_5$ in the core-external segments of signal path CS, a transmission line is formed for the horizontal segments of signal path CS, that provides return current paths as reflections of current $I_S$ in the opposing direction. However, no vertical reference plane exists to maintain the transmission line behavior around blind vias BV1, BV2 and BV3 and according to Ampere's law, the magnetic field will extend around blind vias BV1, BV2 and BV3 to at least the region where the return current $I_R$ of signal path CS is included within the region. For the above reason, return current $I_R$ is shown to the right of the diagram to illustrate that a return current path exists, but without an explicit conductive path within the substrate, the path could be in an external power supply, external circuits, or within undesired circuit paths within the substrate. The net result is current loops that can inductively couple to other signals and in some cases launch electromagnetic radiation that will cause interference with other devices.

Figure 1B:
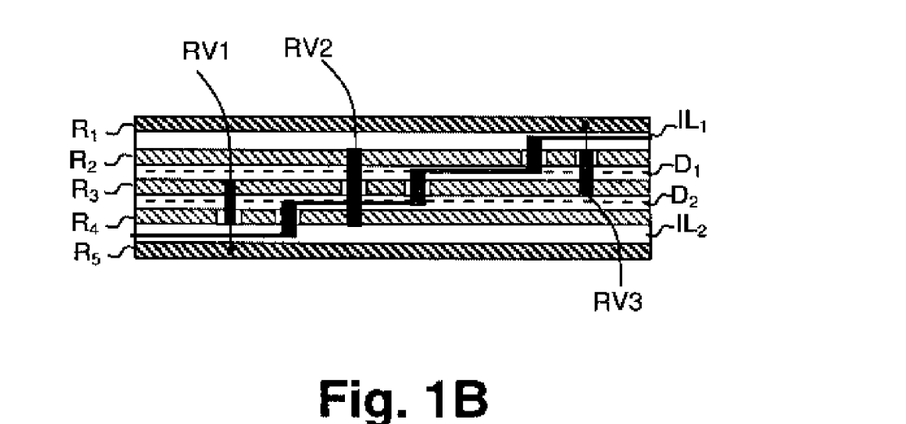

Referring now to FIG. 1B, a cross-section of an integrated circuit substrate as analyzed and optimized in accordance with an embodiment of the invention, is shown. The substrate of FIG. 1B has the same elements are the substrate of FIG. 1A, but return current vias RV1, RV2 and RV3 are located close to corresponding blind vias BV1, BV2 and BV3 providing suitable return current paths that minimize the current loops formed due to signal path discontinuities caused by blind vias BV1, BV2 and BV3. Return current vias RV1, RV2 and RV3, may be additional vias added for the purpose of reducing the current loops, but the present invention provides mechanisms for verifying that the position of existing vias is adequate to meet desired performance criteria, and adjusting the design if the criteria is not met. The present invention also provides for computation of figures-of-merit for an existing design. Blind via BV2 is completely buried, and transitions from between metal reference planes $R_2$ and $R_3$ to between metal reference planes $R_3$ and $R_4$. Return current conducted on metal reference plane $R_3$ is not disrupted, as the horizontal profile of signal path CS is substantially continuous and is located adjacent to metal reference plane $R_3$ for the segments of signal path CS connected to both ends of blind via BV2. However, the return current conducted on reference planes $R_2$ and $R_4$ is disrupted by the transition of signal path CS from between metal reference planes $R_2$ and $R_3$ to between metal reference planes $R_3$ and $R_4$. Therefore, via RV2 is provided (or adjusted by design) adjacent to blind via BV2, to reduce the size of the current loop produced by the vertical disruption of signal path CS due to blind via BV2, by connecting at least metal reference planes $R_2$ and $R_4$, so that a substantially continuous return current path is provided in the vicinity of blind via BV2.

Return current vias RV1 and RV3 are similarly provided (or adjusted to be) proximate to corresponding blind vias BV1 and BV3, but since the transition of blind via BV3 through metal reference plane $R_2$ passes outside of the core, return current via RV3, which connects at least to metal reference plane $R_3$, terminates at the upper surface of the core and a connection is provided by wire, solder ball or other suitable connection to metal reference plane $R_1$. Similarly, return current via RV1 connects to at least metal reference plane $R_3$, terminates at the lower surface of the core, and is similarly connected to metal reference plane $R_5$. For other blind via configurations where the endpoints are not external to the core, the return current via(s) should extend to the metal reference planes above and below the endpoints.

Figure 1C:
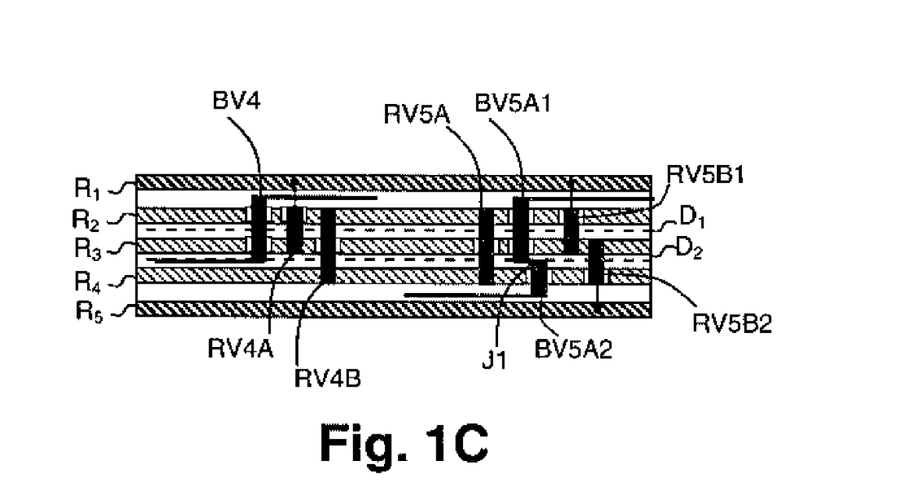

Referring now to FIG. 1C, another integrated substrate design is shown, in which a blind via BV4 transitions across two metal reference planes $R_2$ and $R_3$. Two suitable corresponding return current vias RV4A and RV4B are needed to provide for return current continuity in the vicinity of blind via BV4. Return current via RV4A provides for local connection of metal reference planes $R_1$ and $R_3$ and return current via RV4B connects metal reference planes $R_2$ and $R_4$, so that return current paths are provided for both power planes surrounding the signal path portions connected by blind via BV4. Another blind via structure to the right of the Figure, shows a more general via structure, in which the via "jogs" in dielectric layer $D_2$, which represents a common structure used to meet manufacturing process requirements. Blind via portion BV5A is connected to another blind via portion BV5B by jog path J1 providing for electrical continuity of the overall blind via, which is considered a single blind via due to the proximity of blind via portions BV5A and BV5B. As with blind via BV4, return current vias are needed for both power planes, and are provided by return current via RV5A and a pair of return current via portions RV5B1 and RV5B2 that are also "jogged" on either side of metal reference plane $R_3$.

Figure 2A:
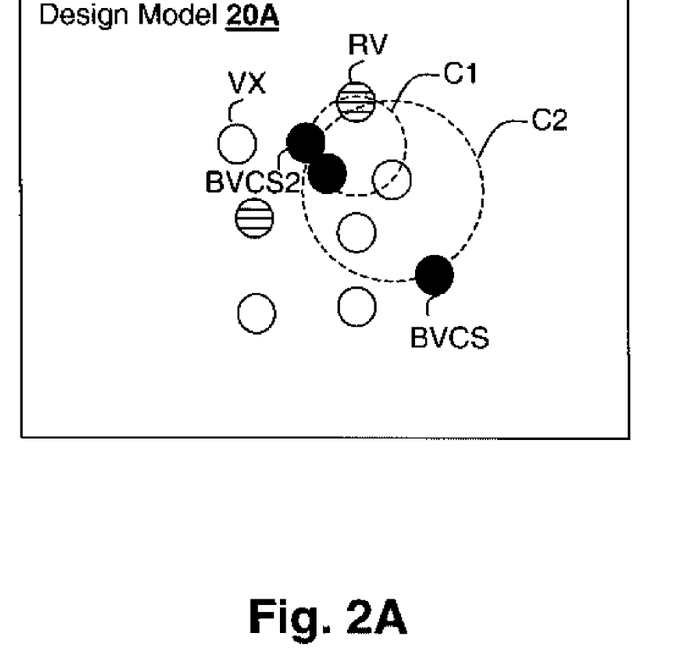
FIGS. 2A-2B are top views of integrated circuit substrate design model via and blind via locations as analyzed by a method in accordance with an embodiment of the present invention.

Referring now to FIG. 2A, a design model 20A of a top view of an integrated circuit substrate core is shown. A number of vias is shown with blind vias carrying critical signals BVCS shown as darkened circles, static (non-critical) signal vias VX shown as empty circles and suitable return current vias RV shown as hatched circuits. As noted above, suitability of return current vias RV is dependent on the particular critical signal blind vias BVCS, since the suitability depends on which metal reference planes a particular blind via BVCS transits, and which metal reference planes are connected by corresponding return current vias RV. For simplicity, it is assumed in the example that all of the illustrated return current vias RV connect all of the core metal reference layers, and therefore are suitable as return current vias for all critical signal blind vias BVCS. In accordance with one embodiment of the present invention, circular regions C1 and C2 are defined from the midpoint of each critical signal blind via BVCS to the midpoint of the nearest suitable return current via RV. If via with "jogs" are analyzed, the circular regions may be adjusted to include all of the via portion profiles, for example blind via BVCS2 is shown having a jogged via profile. The software/method of the present invention performs various checks, the first being the distance between each critical signal blind via BVCS and the nearest suitable return current via RV. Other criteria are the number of other critical signal vias BVCS within each region C1 and C2 and the total number of suitable return current vias RV within each region C1 and C2. Generally, static signal and non-return current path power or reference plane vias VX are ignored, as they do not contribute to coupled noise and do not provide current return paths.

From the count of total other critical signal vias BVCS and the number of suitable return current vias RV for a given critical signal blind via BVCS, a "quality" value can be computed as the ratio of the number of suitable return current vias RV to the number of other critical signal vias BVCS. The quality value can be used as a design rule, a design check, or as a figure-of-merit representing an expected level of coupled noise on the critical signal. For example, a design check may be imposed that all quality values will be greater than 0.3, or a design rule may provide that all quality values are greater than 2.

Figure 2B:
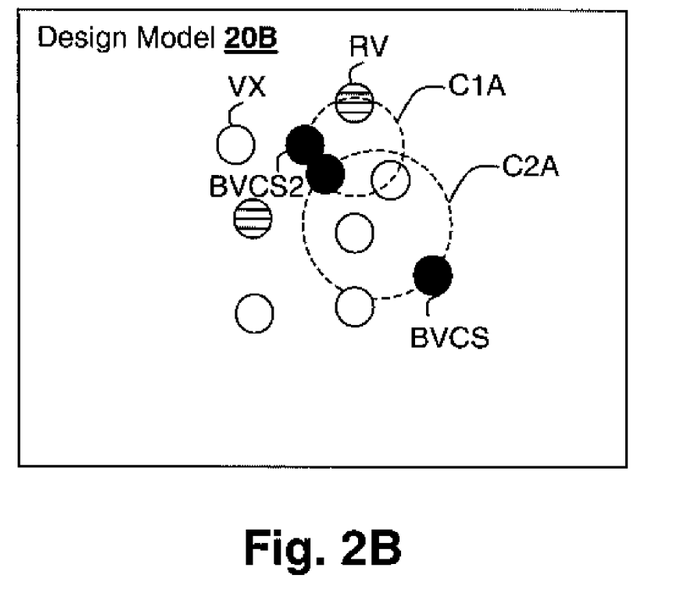

Referring now to FIG. 2B, another design model 20B of a top view of an integrated circuit substrate core is shown. Model 20B is similar to model 20A of FIG. 2A, so only differences between them will be described below. In model 20B circular regions C1A and C2A are defined from the center of each critical signal blind via BVCS to the nearest of another critical signal blind via BVCS and suitable return current via RV, yielding a slightly different result than in design model 20A as the presence of nearby other critical signal blind vias BVCS will reduce the size of the region in which a suitable return current via RV must be present to meet the quality value requirements.

Figure 3:
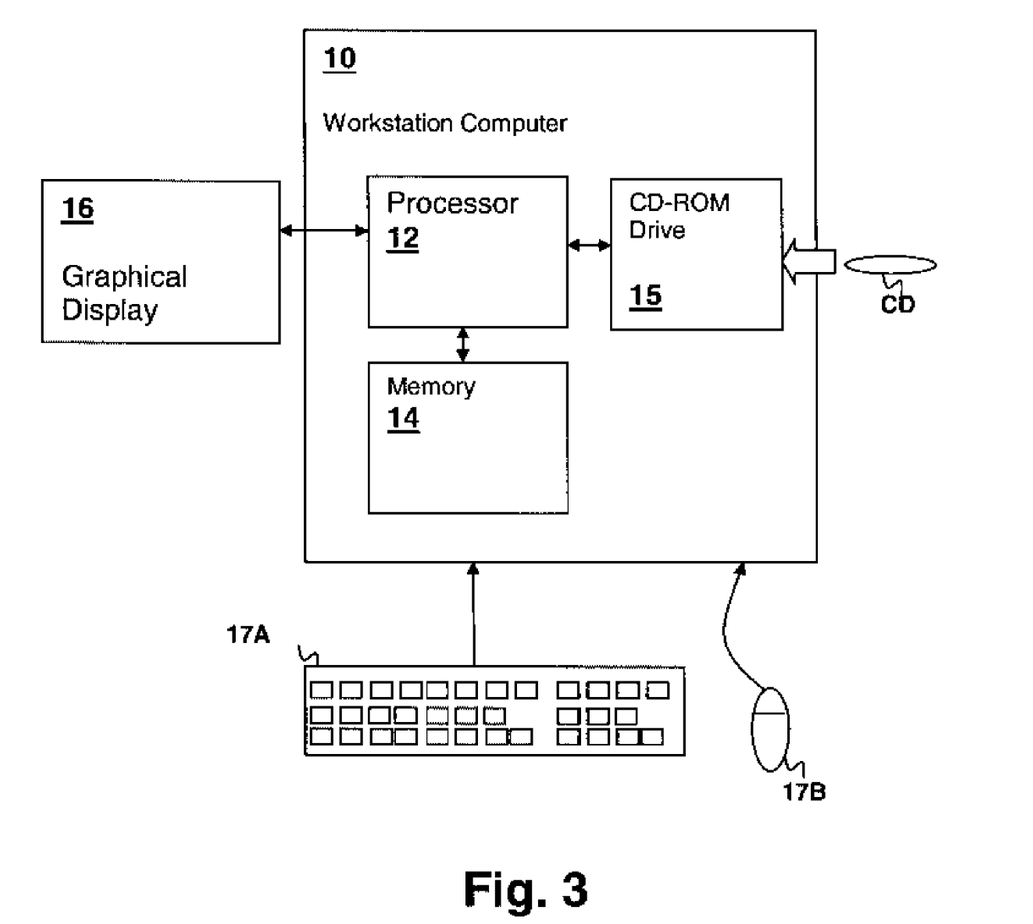
FIG. 3 is a pictorial diagram depicting a workstation computer system by which design methods and computer program products are executed in accordance with an embodiment of the present invention.

Referring now to FIG. 3, a workstation computer system 10 is shown in which the methods of the present invention are carried out in accordance with an embodiment of the present invention, according to program instructions that may be embodied in a computer program product in accordance with a present invention, for example program instructions stored on a CD-ROM disc CD. Workstation computer system 10 includes a processor 12 for executing the program instructions coupled to a memory 14 for storing the program instructions, data and results used in designing integrated circuit substrates in accordance with embodiments of the present invention. Workstation computer system 10 also includes peripheral devices such as CD-ROM drive 15 for reading discs such as CD in order to load the program instructions into workstation computer 10. Input devices, such as a keyboard 17A and a mouse 17B are coupled to workstation computer system 10 for receiving user input. A graphical display 16 is provided for displaying results such as the layout of integrated circuit substrate layers and simulations. The depicted workstation computer system 10 is only exemplary and illustrates one type of computer system and arrangement suitable for carrying out the design methods of the present invention. The design methods generally identify the locations of critical signal blind vias and generate a mask design for signal planes that includes suitable return current vias positioned to locate them proximate to the corresponding critical signal blind vias. Workstation computer 10 also computes and displays quality values as described above for each critical signal blind via and optionally uses the quality values to adjust the position of vias in the design model and/or compute a noise figure of merit for each blind via and/or the corresponding signals by combining the expected coupled noise values for each blind via along the corresponding signal paths.

Figure 4:
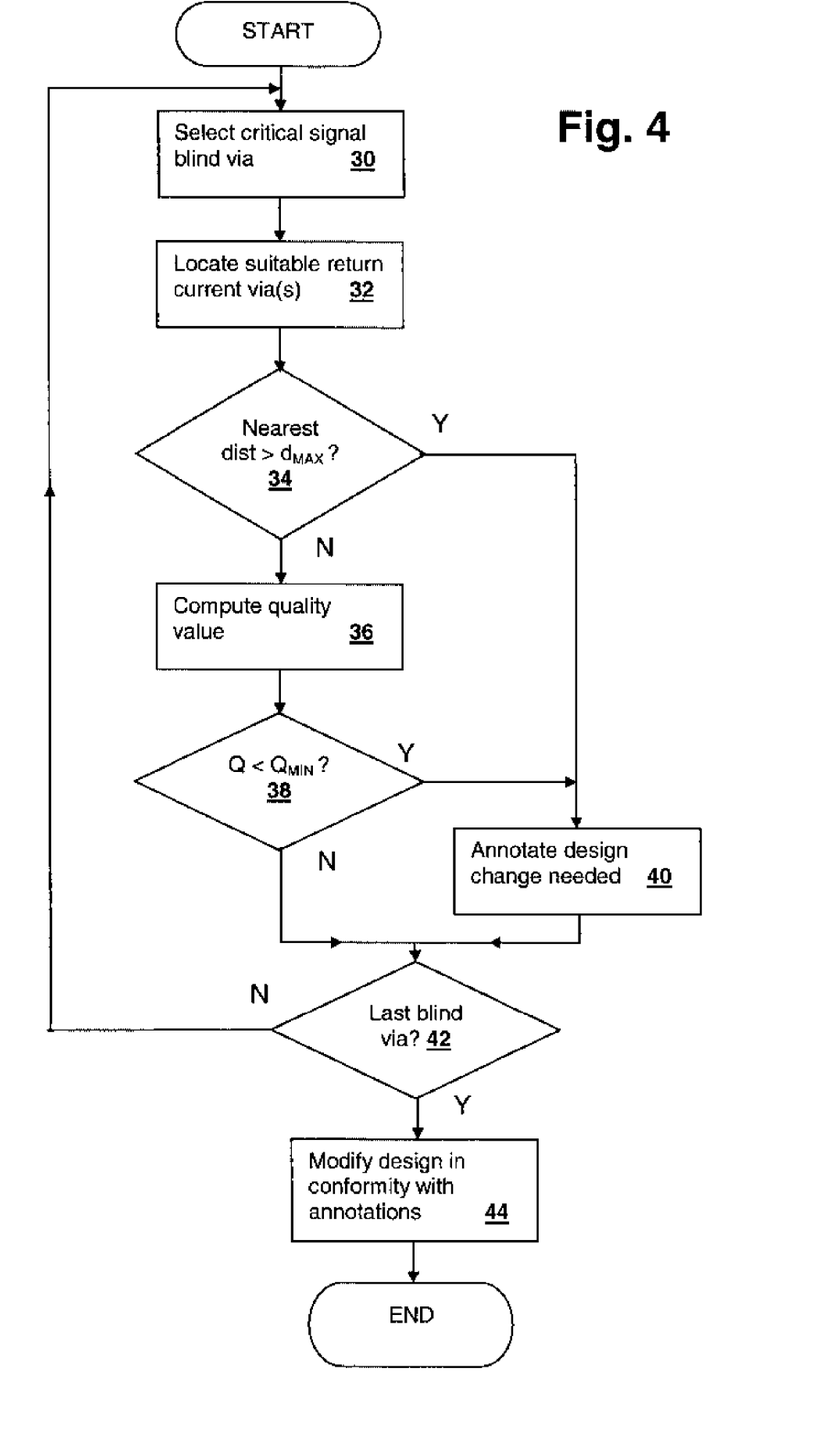
FIG. 4 is a flowchart illustrating a method in accordance with an embodiment of the present invention.

Referring now to FIG. 4, a method in accordance with an embodiment of the invention is depicted in a flowchart. First, a critical signal blind via is selected (step 30) and suitable return current via(s) are located (step 32). If the distance dist between the blind via and the suitable return current via is less than or equal to a specified threshold $d_{MAX}$ (decision 34), then the quality value Q is computed (step 36) and compared to the quality value design check threshold $Q_{MIN}$ and if the quality value Q is sufficiently high (decision 38), then the method advances to the next critical signal blind via, until the last blind via has been checked (decision 42). If the distance dist between the blind via and the suitable return current via is greater than specified threshold $d_{MAX}$ (decision 34) or quality value Q is too low (decision 38), then needed design changes are annotated (step 40). After the last critical signal blind via has been checked (decision 42), then the design is modified in conformity with the annotations (step 44). The entire method may be repeated in an iterative fashion with appropriate convergence controls.

The method may alternatively be implemented as a module within a design program that tabulates the values produced by the method or graphically highlights the locations of blind vias that meet/do not meet the design criteria, and the iterative re-design portion of the method is optional. The software may thus be a stand-along analysis package that analyzes a design without adjusting the locations of return current vias or blind vias to meet the design criteria and the design iteration is then performed at least partially by a user.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A computer-performed method of designing an electrical circuit interconnect structure, comprising:
   in a computer model of an interconnect structure design implemented by a computer system, determining that a blind via transitioning vertically from a signal layer located between a first metal reference plane and a second metal reference plane through the second metal reference plane is a via conducting a critical signal, and wherein the signal layer and the first and second metal reference planes are parallel to each other;
   checking other vias in a horizontal vicinity of the blind via for at least one other via that provides a return current path from the first metal reference plane to another metal reference plane, wherein the another metal reference plane is a metal reference plane other than the first and second metal reference planes, for transporting a return current conducted in the first metal reference plane to the another metal reference plane, wherein the return current is a return current for the critical signal;
   determining whether or not a distance between horizontal positions of the blind via and the at least one other via is greater than a specified threshold;

responsive to determining that the distance between the horizontal positions of the blind via and the at least one other via is greater than the specified threshold, altering the computer model of the interconnect structure design to change the horizontal position of the blind via or the at least one other via to reduce the distance between the horizontal positions of the blind via and the at least one other via, whereby an area of an inductive loop formed between the blind via and a path of the return current is reduced; and storing an altered computer model resulting from the altering in a memory of the computer system.

2. The computer-performed method of claim 1, wherein in the computer model of the interconnect structure design, the second metal reference plane is an outer reference plane of a core, and wherein the checking finds the at least one other via as a via that connects the first metal reference plane to a terminal for connection to the another metal reference plane external to the core.

3. The computer-performed method of claim 1, wherein in the computer model of the interconnect structure design, the blind via transitions from the signal layer to another signal layer that is located between the second metal reference plane and a third metal reference plane, wherein the another metal reference plane is the third metal reference plane, and wherein the checking finds the at least one other via as a via that connects the first metal reference plane and the third metal reference plane, whereby a portion of the return current conducted on the first metal reference plane is conducted through the at least one other via to the third metal reference plane.

4. The computer-performed method of claim 1, further comprising computing a quality value for the blind via in conformity with a proximity of other critical signal vias and reference return vias.

5. The computer-performed method of claim 4, wherein the computing a quality value comprises defining a horizontal region around the blind via including the at least one other via, and determining the quality value from a ratio of a number of reference return vias connecting the first metal reference plane to the another metal reference plane to a number of critical signal vias passing through the region, and further comprising comparing the quality value to a predetermined threshold to determine whether or not the blind via meets signal quality requirements.

6. The computer-performed method of claim 5, wherein the defining defines a circular region having a center at the center of the blind via and a radius intersecting the at least one other via.

7. The computer-performed method of claim 4, wherein the computing a quality value comprises defining a horizontal region around the blind via including the closest of another critical signal via or the at least one other via, and determining the quality value from a ratio of a number of reference return vias connecting the first metal reference plane to the another metal reference plane to a number of critical signal vias passing through the region, and further comprising comparing the quality value to a predetermined threshold to determine whether or not the blind via meets signal quality requirements.

8. The computer-performed method of claim 1, further comprising:
locating a region around the blind via including the at least one other via;
determining a ratio of a number of reference return vias connecting the first metal reference plane to the another metal reference plane to a number of critical signal vias passing through the region; and
displaying a value derived from the ratio as a circuit noise figure of merit.

9. The computer-performed method of claim 1, further comprising generating masks for the interconnect structure design in conformity with a result of the altering.

10. An electrical circuit interconnect structure produced from the masks generated by the method of claim 9.

11. A computer program product comprising storage media containing program instructions for execution by a processor for designing an electrical circuit interconnect structure, the program instructions comprising program instructions for:
in a computer model of an interconnect structure design, determining that a blind via transitioning vertically from a signal layer located between a first metal reference plane and a second metal reference plane through the second metal reference plane is a via conducting a critical signal, and wherein the signal layer and the first and second metal reference planes are parallel to each other;
checking other vias in a horizontal vicinity of the blind via for at least one other via that provides a return current path from the first metal reference plane to another metal reference plane, wherein the another metal reference plane is a metal reference plane other than the first and second metal reference planes, for transporting a return current conducted in the first metal reference plane to the another metal reference plane, wherein the return current is a return current for the critical signal;
determining whether or not a distance between the horizontal positions of the blind via and the at least one other via is greater than a specified threshold; and
responsive to determining that the distance between the horizontal positions of the blind via and the at least one other via is greater than the specified threshold, altering the computer model of the interconnect structure design to change the horizontal position of the blind via or the at least one other via to reduce the distance between the horizontal positions of the blind via and the at least one other via, whereby an area of an inductive loop formed between the blind via and a path of the return current is reduced.

12. The computer program product of claim 11, wherein in the computer model of the interconnect structure design, wherein in the computer model of the interconnect structure design, the second metal reference plane is an outer reference plane of a core, and wherein the checking finds the at least one other via as a via that connects the first metal reference plane to a terminal for connection to the another metal reference plane external to the core.

13. The computer program product of claim 11, wherein in the computer model of the interconnect structure design, the blind via transitions from the signal layer to another signal layer that is located between the second metal reference plane and a third metal reference plane, wherein the other metal reference plane is the third metal reference plane, and wherein the program instructions for checking find the at least one other via as a via that connects the first metal reference plane and the third metal reference plane, whereby a portion of the return current conducted on the first metal reference plane is conducted through the at least one other via to the third metal reference plane.

14. The computer program product of claim 11, wherein the program instructions further comprise program instructions for computing a quality value for the blind via in conformity with a proximity of other critical signal vias and reference return vias.

15. The computer program product of claim 14, wherein the program instructions for computing a quality value comprise program instructions for defining a horizontal region around the blind via including the at least one other via, and determining the quality value from a ratio of a number of reference return vias connecting the first metal reference plane to the another metal reference plane to a number of critical signal vias passing through the region, and further comprising program instructions for comparing the quality value to a predetermined threshold to determine whether or not the blind via meets signal quality requirements.

16. The computer program product of claim 15, wherein the program instructions for defining define a circular region having a center at the center of the blind via and a radius intersecting the at least one other via.

17. The computer program product of claim 14, wherein the program instructions for computing a quality value comprise program instructions for defining a horizontal region around the blind via including the closest of another critical signal via or the at least one other via, and determining the quality value from a ratio of a number of reference return vias connecting the first metal reference plane to the another metal reference plane to a number of critical signal vias passing through the region, and further comprising comparing the quality value to a predetermined threshold to determine whether or not the blind via meets signal quality requirements.

18. The computer program product of claim 11, further comprising program instructions for:
    locating a region around the blind via including the at least one other via;
    determining a ratio of a number of reference return vias connecting the first metal reference plane to the another other metal reference plane to a number of critical signal vias passing through the region; and
    displaying a value derived from the ratio as a circuit noise figure of merit.

19. The computer program product of claim 11, further comprising program instructions for generating masks for the interconnect structure design in conformity with a result of the altering.

20. A workstation computer system, comprising a processor for executing program instructions and a memory for storing the program instructions and data, wherein the program instructions include program instructions for designing an electrical circuit interconnect structure, the program instructions comprising program instructions for:
    in a computer model of an interconnect structure design, determining that a blind via transitioning vertically from a signal layer located between a first metal reference plane and a second metal reference plane through the second metal reference plane is a via conducting a critical signal, and wherein the signal layer and the first and second metal reference planes are parallel to each other;
    checking other vias in a horizontal vicinity of the blind via for at least one other via that provides a return current path from the first metal reference plane to another metal reference plane, wherein the another metal reference plane is a metal reference plane other than the first and second metal reference planes, for transporting a return current conducted in the first metal reference plane to the another metal reference plane, wherein the return current is a return current for the critical signal;
    determining whether or not a distance between the horizontal positions of the blind via and the at least one other via is greater than a specified threshold; and
    responsive to determining that the distance between the horizontal positions of the blind via and the at least one other via is greater than the specified threshold, altering the computer model of the interconnect structure design to change the horizontal position of the blind via or the at least one other via to reduce the distance between the horizontal positions of the blind via and the at least one other via, whereby an area of an inductive loop formed between the blind via and a path of the return current is reduced.

21. The workstation computer system of claim 20, wherein in the computer model of the interconnect structure design, the second metal reference plane is an outer reference plane of a core, and wherein the checking finds the at least one other via as a via that connects the first metal reference plane to a terminal for connection to the another metal reference plane external to the core.

22. The workstation computer system of claim 20, wherein in the computer model of the interconnect structure design, the blind via transitions from the signal layer to another signal layer that is located between the second metal reference plane and a third metal reference plane, wherein the another metal reference plane is the third metal reference plane, and wherein the program instructions for checking find the at least one other via as a via that connects the first metal reference plane and the third metal reference plane, whereby a portion of the return current conducted on the first metal reference plane is conducted through the at least one other via to the third metal reference plane.

23. The workstation computer system of claim 20, wherein the program instructions further comprise program instructions for computing a quality value for the blind via in conformity with a proximity of other critical signal vias and reference return vias.

24. The workstation computer system of claim 23, wherein the program instructions for computing a quality value comprise program instructions for defining a horizontal region around the blind via including the at least one other via, and determining the quality value from a ratio of a number of reference return vias connecting the first metal reference plane to the another metal reference plane to a number of critical signal vias passing through the region, and further comprising program instructions for comparing the quality value to a predetermined threshold to determine whether or not the blind via meets signal quality requirements.

25. The workstation computer system of claim 24, wherein the program instructions for defining define a circular region having a center at the center of the blind via and a radius intersecting the at least one other via.

26. The workstation computer system of claim 23, wherein the program instructions for computing a quality value comprise program instructions for defining a horizontal region around the blind via including the closest of another critical signal via or the at least one other via, and determining the quality value from a ratio of a number of reference return vias connecting the first metal reference plane to the another ether metal reference plane to a number of critical signal vias passing through the region, and further comprising comparing the quality value to a predetermined threshold to determine whether or not the blind via meets signal quality requirements.

27. The workstation computer system of claim 20, further comprising program instructions for:

locating a region around the blind via including the at least one other via;

determining a ratio of a number of reference return vias connecting the first metal reference plane to the another metal reference plane to a number of critical signal vias passing through the region; and displaying a value derived from the ratio as a circuit noise figure of merit.

28. The workstation computer system of claim 20, further comprising program instructions for generating masks for the interconnect structure design in conformity with a result of the altering.

29. A computer-performed method of designing an electrical circuit interconnect structure, comprising:

in a computer model of an interconnect structure design implemented by a computer system searching other vias in a vicinity of a blind via conducting a critical signal and transitioning vertically from a signal layer located between a first metal reference plane and a second metal reference plane through the second metal reference plane, for at least one other via that provides a return current path from the first metal reference plane to another metal reference plane, wherein the another metal reference plane is a metal reference plane other than the first and second metal reference planes;

checking the blind via according to criteria for effectiveness of the at least one other via to reduce an area of an inductive loop formed between the blind via and a path of the return current;

adjusting the computer model of the interconnect structure design to reduce the area of the inductive loop;

storing an adjusted computer model of the interconnect structure design resulting from the adjusting in a memory of a computer system.

30. The computer-performed method of claim 29, further comprising assigning to each via, a value indicating a quality of a return current path provided for the blind via.

* * * * *